(12) United States Patent
Heck

(10) Patent No.: US 8,018,821 B2
(45) Date of Patent: Sep. 13, 2011

(54) PROTECTION LAYERS FOR MEDIA PROTECTION DURING FABRICATION OF PROBE MEMORY DEVICE

(75) Inventor: John Heck, Berkeley, CA (US)

(73) Assignee: Intel Corporation, Santa Clara, CA (US)

(*) Notice: Subject to any disclaimer, the term of this patent is extended or adjusted under 35 U.S.C. 154(b) by 267 days.

(21) Appl. No.: 12/242,769

(22) Filed: Sep. 30, 2008

(65) Prior Publication Data

US 2010/0127727 A1 May 27, 2010

(51) Int. Cl.
*G11B 9/00* (2006.01)
(52) U.S. Cl. ....................................................... 369/126
(58) Field of Classification Search .................. 369/126; 365/151; 250/309–311
See application file for complete search history.

(56) References Cited

U.S. PATENT DOCUMENTS

| | | | | |
|---|---|---|---|---|
| 5,216,631 A * | 6/1993 | Sliwa, Jr. | ...................... | 365/174 |
| 7,629,201 B2 * | 12/2009 | Gan et al. | ...................... | 438/106 |
| 2002/0040983 A1 * | 4/2002 | Fitzergald | ...................... | 257/183 |
| 2005/0082252 A1 * | 4/2005 | Nasiri et al. | ...................... | 216/2 |
| 2009/0201015 A1 * | 8/2009 | Adams et al. | ...................... | 324/210 |

* cited by examiner

*Primary Examiner* — Joseph H Feild
*Assistant Examiner* — Nicholas Lee
(74) *Attorney, Agent, or Firm* — Kevin A. Reif

(57) ABSTRACT

A micro-electro-mechanical system (MEMS) seek-scan probe (SSP) memory device utilizes a protective layer over the delicate media layer to protect the media during harsh processing steps that may otherwise damage the media layer. The protective layer may comprise a layer of germanium and a layer of silicon dioxide.

19 Claims, 5 Drawing Sheets

PROTECTION LAYERS FOR MEDIA PROTECTION DURING FABRICATION OF PROBE MEMORY DEVICE

FIELD OF THE INVENTION

Embodiments of the present invention are directed to micro-electro-mechanical system (MEMS) fabrication and, more particularly, to a protecting the media film of a MEMS probe memory device during the fabrication process.

BACKGROUND INFORMATION

Seek-scan probe (SSP) memories are a type of memory that uses non-volatile storage media as the data storage mechanism and offers significant advantages in both cost and performance over conventional charge-storage memories. Typical SSP memories include storage media made of materials that can be electrically switched between two or more states having different electrical characteristics such as resistance, polarization dipole direction, or some other characteristic.

SSP memories are written to by passing an electric current through the storage media or applying an electric field to the storage media. Passing a current through the storage media, or applying an electric field to the media, is typically accomplished by applying a voltage between a sharp probe tip on one side of the storage media and an electrode on the other side of the storage media. Current SSP memories use probe tips positioned on a free end of one or more MEMS probes. In an idle state each MEMS probe maintains the probe tip at a certain distance from the storage media, but before the electric field or current can be applied to the storage media the probe tip must usually be brought dose to, or in some cases in direct contact with, the storage media.

In order to fabricate an SSP memory device based on ferroelectric media, a high-quality media film must be deposited on virgin silicon wafers. These wafers must subsequently be subjected to many steps to create the mechanical and electrical functionality to enable the memory device. This processing may include multiple film depositions, lithography, etching, electroplating, and wafer bonding processes for example. These steps can cause significant damage to the media film by mechanical abrasion, chemical exposure, thermal treatment, etc.

BRIEF DESCRIPTION OF THE DRAWINGS

The foregoing and a better understanding of the present invention may become apparent from the following detailed description of arrangements and example embodiments and the claims when read in connection with the accompanying drawings, all forming a part of the disclosure of this invention. While the foregoing and following written and illustrated disclosure focuses on disclosing arrangements and example embodiments of the invention, it should be clearly understood that the same is by way of illustration and example only and the invention is not limited thereto.

DETAILED DESCRIPTION

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1A:
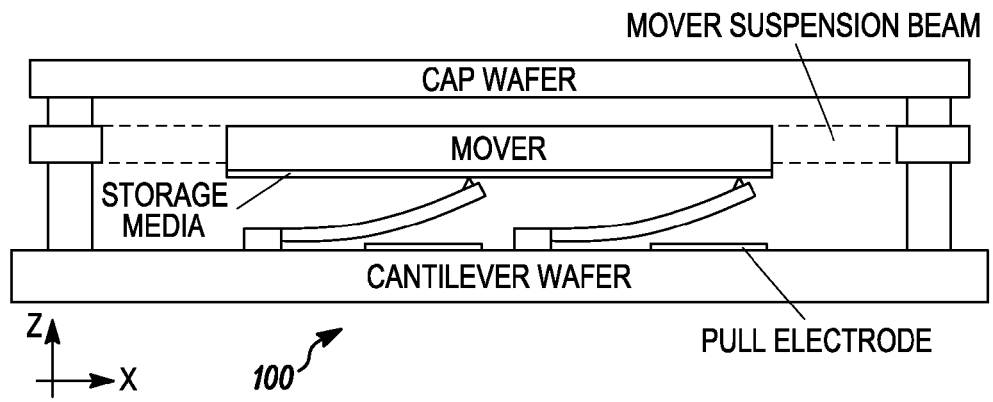
FIGS. 1A-1C are diagrams showing an illustrative SSP memory device and its basic operation.
Figure 1B:
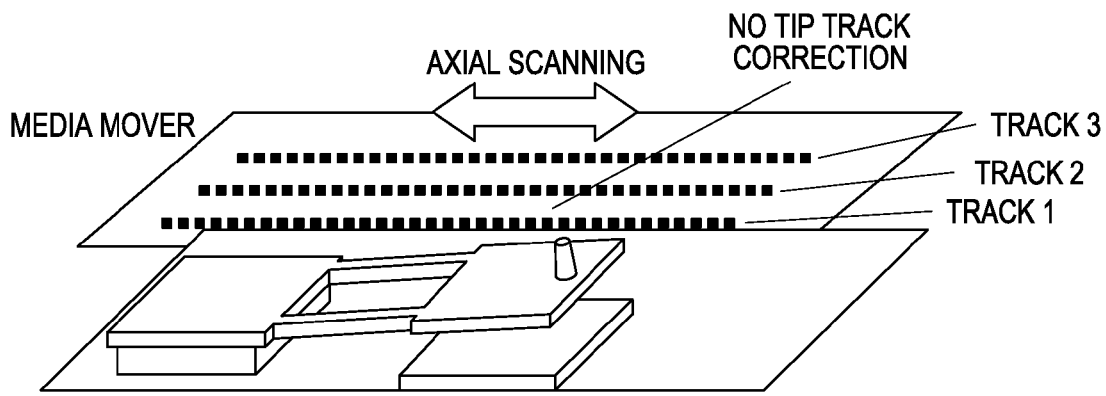
Figure 1C:
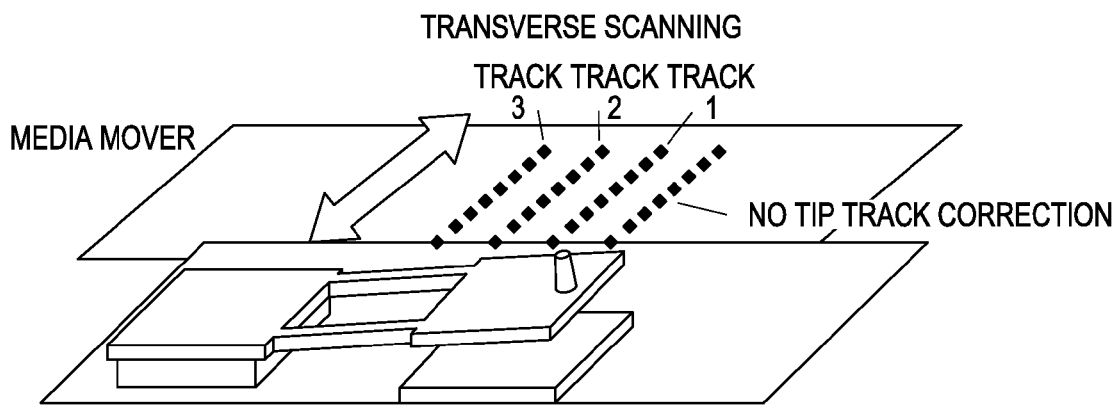

FIGS. 1A-1C illustrate tracking in a common SSP memory configuration. FIG. 1A illustrates an SSP memory configuration in which a cantilever probe is anchored to a substrate (the cantilever wafer), and can be actuated to contact or de-contact the storage media on a mover that carries a storage media and is positioned over the cantilever wafer. The data tracks are stored in the storage media in one of two ways, depending on how the media mover scans relative to the cantilever tips.

FIG. 1B illustrates axial scanning, where data is stored in the storage media in-line with the cantilever direction, such that the mover scans in the direction parallel to a longitudinal axis of the cantilever to read/write/erase (R/W/E) each data track.

FIG. 1C illustrates transverse scanning, where the media mover scans in a direction perpendicular to the longitudinal axis of the cantilever probe to R/W/E each data track; data is consequently stored in lines that are transverse to the cantilever's longitudinal axis. To maximize the amount of data that can be written in the storage media the data density should be very high. During the fabrication process the media is easily damaged and therefore according to embodiments, a protection layer is herein used to protect the media throughout the process.

Figure 2A:
FIG. 2A-2B are diagrams showing a mover wafer including a protective layer added prior to processing to protect the media layer according to one embodiment.

FIG. 2A shows a mover wafer 200 including the media layer 202. The media layer may comprise a dielectric layer, such as a layer of Lead Zirconate Titanate (PZT), for example. According to embodiments, a media protection layer is added over the media layer 202. The protection layer comprises a germanium film 204 that is deposited on the media 202, followed by a capping layer of silicon dioxide 206. The Ge can be deposited by evaporation, sputtering, or chemical vapor deposition (CVD) for example. It is stable to high temperatures expected during mover processing (up to 400° C.) and can be removed selectively to the media film 202 once the mover process is completed.

The germanium-based protection layer 202 provides many advantages. First, the germanium film 202 can be deposited using a variety of gentle processes such as electron beam evaporation or chemical vapor deposition that does not damage the media 202.

Second, the Ge may be removed by gentle chemical cleaning after mover processing. This can be done using hydrogen peroxide, or even hot water saturated with ozone or dissolved oxygen.

Third, since Ge is a semiconductor, it is extremely stable across the range of temperatures required for mover processing (up to 400 C), Since Ge can be etched relatively easily, a cap layer of silicon dioxide 206 is proposed for protecting the Ge throughout the wet cleaning steps in the mover process. The $SiO_2$ 204 can be dry-etched selectively to Ge prior to Ge removal at the end of the process. The Ge—$SiO_2$ protection layer is also very resistant to abrasion or mechanical damage due to its high hardness.

Alternatives to the Ge—$SiO_2$ protection layer include polymers, metals, other semiconductors, glassy materials such as oxides or nitrides; however, these have various drawbacks. Fabricating the mover without using a protection layer exposes the media to extensive processes that may cause mechanical (abrasion) or chemical attack. Materials such as oxides and nitrides can be ruled out because they are typically etched using aggressive acids including Hydrofluoric acid (HF), which are not selective to the media film. Polymers normally cure or harden upon exposure to high temperature steps, and may be very difficult to remove. Metals are expected to diffuse into the media film at high temperatures, which may degrade or destroy the media properties.

The Ge—$SiO_2$ layer, 204 and 206, is capable of surviving the entire mover process, which significantly simplifies the process compared to having different protection layers for different steps.

Figure 2B:

Still referring to FIGS. 2A and 2B, the Ge—$SiO_2$ protection layer, 204 and 206 is integrated into the SSP process as follows. First, the media film 202 is deposited on virgin silicon wafers 200. The media film 202 may then be patterned (not shown), and the Ge layer 204 and $SiO_2$ protection layer 206 is deposited.

Figure 3A:
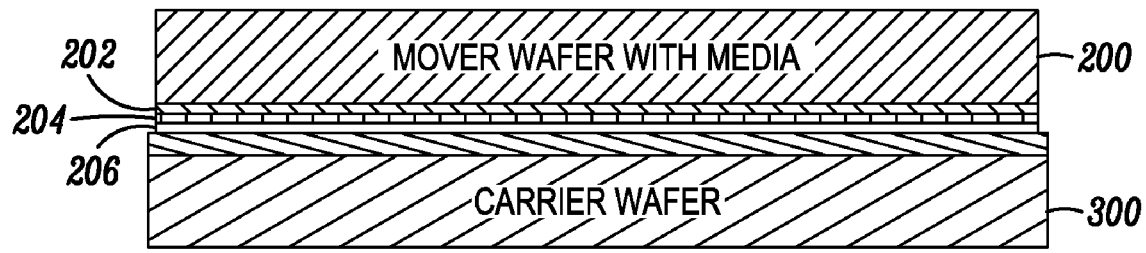
FIGS. 3A-3D are diagrams illustrating the steps taken to fabricate drive and sense circuitry on the mover wafer using a carrier wafer.
Figure 3B:
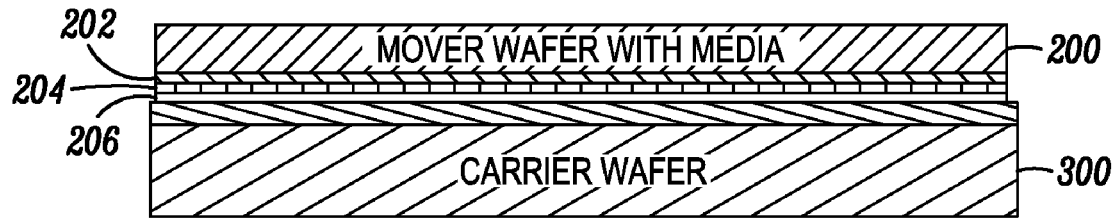
Figure 3C:
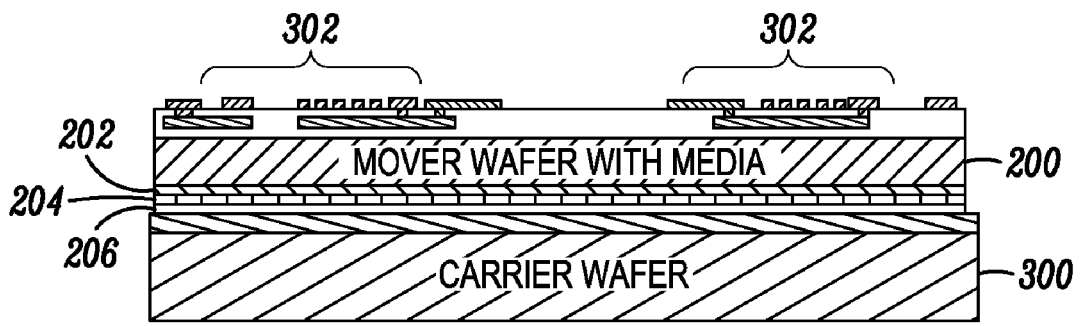
Figure 3D:
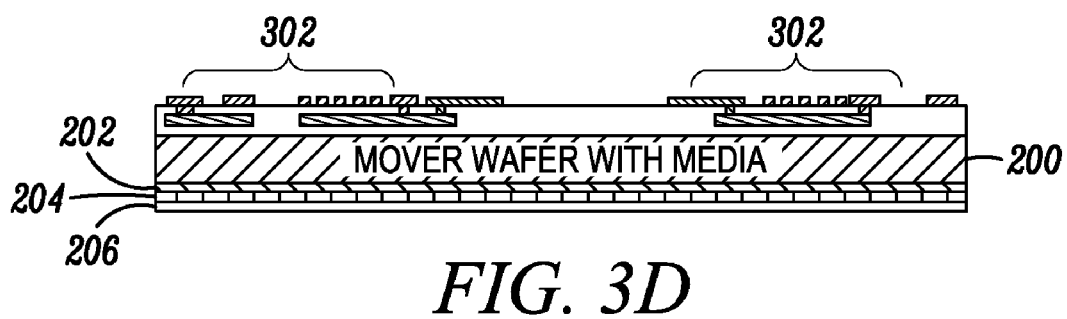

Referring now to FIGS. 3A-3D, the process of creating the mover is performed using a wafer support system. As shown in FIG. 3A, a carrier wafer 300 is bonded to the protective layer, 206 of the mover wafer 200. In FIG. 3B, the mover wafer 200 may be thinned using known techniques. In FIG. 3C, mover drive/sense circuitry 302 is defined on the mover wafer 200. In FIG. 3D, the carrier wafer 300 (shown in the previous Figures) is removed. This processing described above may include multiple film depositions, lithography, etching, electroplating, and wafer bonding processes for example. The media film 202 is protected according to embodiments from the potentially damaging steps processes by the protective layers 204 and 206.

Figure 4A:
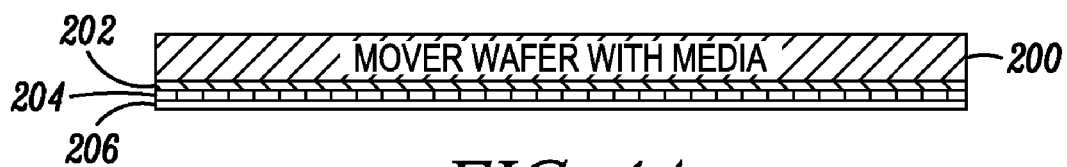
FIGS. 4A-B are diagrams illustrating the steps taken to fabricate drive and sense circuitry on the mover wafer without a carrier wafer.
Figure 4B:
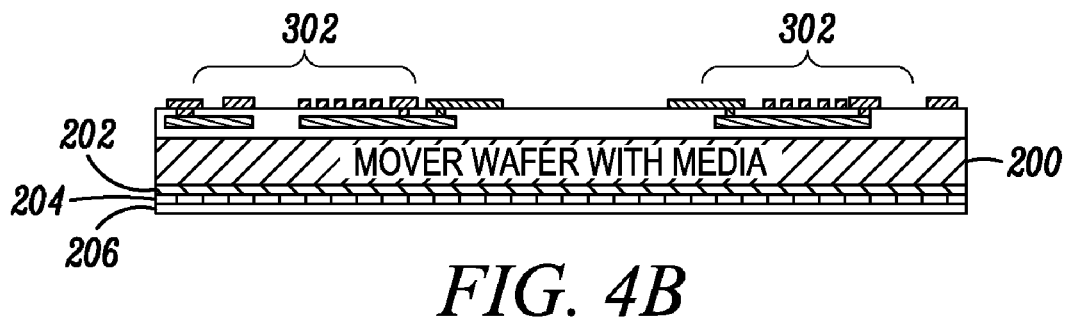

FIGS. 4A and 4B show an alternative method of forming the mover without the wafer support system where the wafer is simply thinned, as shown in 4A, and thereafter the drive/sense circuitry 302 is defined directly on the thinned wafer 200.

Figure 5A:
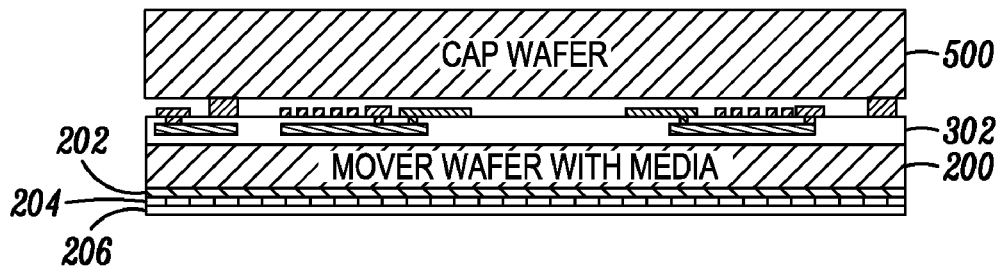
FIGS. 5A-5D are diagrams illustrating attachment of a cap assembly and releasing the mover from the mover wafer.
Figure 5B:
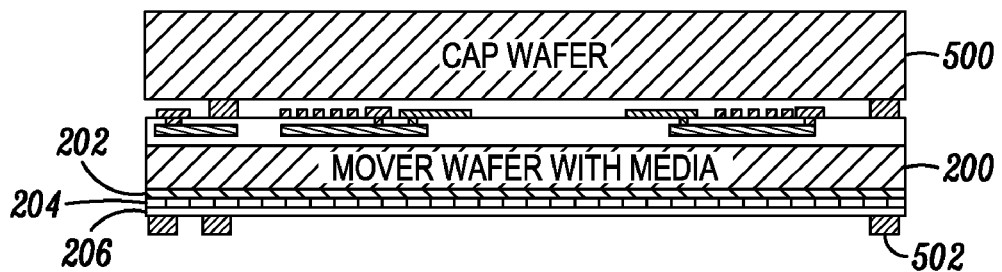
Figure 5C:
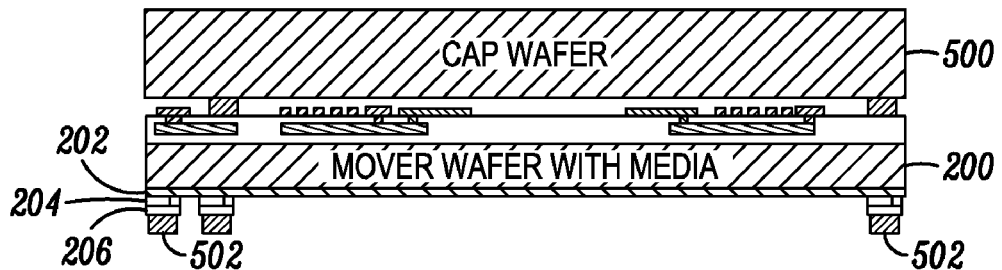
Figure 5D:
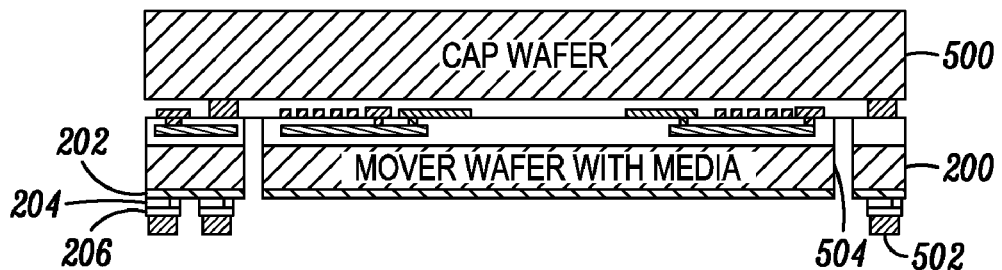

Referring to FIGS. 5A-5D, a Mover-Cap assembly 500 is attached. The cap wafer 500 and mover wafer 200 are bonded together. Bond rings 502 are defined on the bottom of the mover 200 on the protective layer 204 and 206 as shown in FIG. 5B. In FIG. 5C, the protection layer 202 and 204 is removed. Finally, the mover 504 is released by forming a suspension by deep reactive ion etching, for example. Contacts between the media electrode and bond metal may also be formed (not shown).

Figure 6:
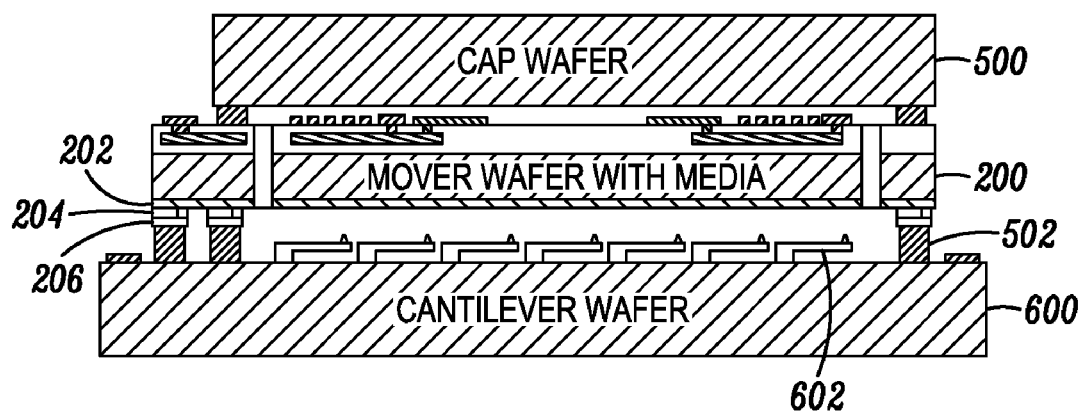
FIG. 6 is a diagram illustrating the completed SSP memory device.

FIG. 6 show the completed Seek-scan probe (SSP) memory device wherein a cantilever wafer 600 including a plurality of MEMS probes 602 is attached to the mover wafer 500 and cap assembly 500. The above process can significantly improve the yield of a probe-based memory device by ensuring the quality of the media 202 throughout the processing of the mover 504. This can improve the manufacturability and reduce the cost, as well as reducing the time-to-market by simplifying the development cycle.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. An apparatus, comprising:
   a cantilever wafer having a plurality of cantilever probes for scanning a media layer;
   a mover wafer comprising the media layer;
   a bond ring connected to the cantilever wafer; and
   a germanium layer and a silicon dioxide layer between the bond ring and the mover wafer.

2. The apparatus as recited in claim 1 wherein the media layer comprises a dielectric material.

3. The apparatus as recited in claim 2 wherein the dielectric material comprises Lead Zirconate Titanate (PZT).

4. The apparatus as recited in claim 2 wherein the germanium layer and the silicon dioxide comprise a layer to protect the media layer and remain after manufacturing.

5. The apparatus as recited in claim 1 further comprising:
   a cap wafer to cover the mover wafer.

6. The apparatus as recited in claim 5, further comprising:
   mover circuitry and sense circuitry on the mover wafer on a side opposite the media layer.

7. The apparatus as recited in claim 1, wherein the apparatus comprises a seek-scan probe (SSP) memory device.

8. A method, comprising:
   depositing a media layer on a mover wafer;
   depositing a germanium layer and a silicon dioxide layer over the media layer to protect the media layer during further processing;
   processing the mover wafer to form a mover;
   attaching a cantilever wafer to one side of the mover wafer with bond rings; and
   removing the germanium layer and a silicon dioxide layer from the media layer on the mover.

9. The method as recited in claim 8, wherein the media layer comprises a dielectric material.

10. The method as recited in claim 9, wherein the dielectric material comprises Lead Zirconate Titanate (PZT).

11. The method as recited in claim 8, wherein the mover is formed with a wafer support.

12. The method as recited in claim 8, wherein the germanium layer is deposited by evaporation.

13. The method as recited in claim 8, wherein the germanium layer is deposited by sputtering.

14. The method as recited in claim 8, wherein the germanium layer is deposited by chemical vapor deposition.

15. The method as recited in claim 8 where the germanium is removed with hydrogen peroxide.

16. The method as recited in claim 8 wherein the germanium is removed by hydrogen peroxide saturated with one of ozone or dissolved oxygen.

17. A seek-scan probe memory device, comprising:
   a cantilever wafer having a plurality of cantilever probes for scanning a media layer;

a mover wafer comprising the media layer;
circuitry formed on the mover wafer;
a bond ring connected to the cantilever wafer; and
a germanium layer and a silicon dioxide layer between the bond ring and the over wafer remaining after the manufacturing process.

18. The seek-scan probe memory device as recited in claim 17, wherein the media layer comprises a dielectric material.

19. The seek-scan probe memory device as recited in claim 17, wherein the dielectric material comprises Lead Zirconate Titanate (PZT).

* * * * *